United States Patent
Cook et al.

[11] Patent Number: 5,159,171
[45] Date of Patent: Oct. 27, 1992

[54] METHOD AND APPARATUS FOR SOLDER LASER PRINTING

[75] Inventors: Kenneth E. Cook, Lake Worth; Allen D. Hertz, Boca Raton; David A. Tribbey; John P. Cheraso, both of Boynton Beach, all of Fla.

[73] Assignee: Motorola, Inc., Schaumburg, Ill.

[21] Appl. No.: 753,540

[22] Filed: Sep. 3, 1991

[51] Int. Cl.⁵ .................................... B23K 26/00
[52] U.S. Cl. .................. 219/121.63; 219/85.12; 219/121.64
[58] Field of Search .............. 219/121.63, 121.64, 219/85.12, 85.13, 85.21; 228/179, 180.2, 180.1, 125, 159, 160, 161, 162, 163

[56] References Cited

U.S. PATENT DOCUMENTS

| | | | |
|---|---|---|---|
| 3,717,742 | 2/1973 | Fottler | 219/85.13 |
| 4,273,859 | 6/1981 | Mones et al. | 228/180.2 |
| 4,320,281 | 3/1982 | Cruickshank et al. | 219/121.64 |
| 4,327,277 | 4/1982 | Daly | 219/121.64 |
| 4,396,140 | 8/1983 | Jaffe et al. | 228/180.2 |
| 4,531,044 | 7/1985 | Chang | 228/179 |
| 4,531,044 | 7/1985 | Chang | 219/121.63 |
| 4,676,426 | 6/1987 | Darrow et al. | 228/125 |
| 4,698,774 | 10/1987 | Abe et al. | 228/180.1 |
| 4,889,275 | 11/1988 | Mullen, III et al. | 228/180.2 |
| 4,926,022 | 5/1990 | Freedman | 219/121.63 |
| 4,995,551 | 2/1991 | Mackay | 228/180.2 |
| 5,055,652 | 10/1991 | Jones et al. | 219/121.64 |

FOREIGN PATENT DOCUMENTS

| | | | |
|---|---|---|---|
| 62-19261 | 4/1987 | Japan | 228/179 |
| 2-114696 | 4/1990 | Japan . | |
| 2-142673 | 5/1990 | Japan . | |
| 8807317 | 9/1988 | PCT Int'l Appl. | 228/180.2 |

*Primary Examiner*—Geoffrey S. Evans
*Attorney, Agent, or Firm*—Pablo Meles

[57] ABSTRACT

A method for solder deposition by the use of a laser (24), comprises the steps of applying a predetermined thickness of solder (6) to a substrate (2) including over a printed circuitry pattern (4) on the substrate, laser printing (24) to a reflow temperature the solder on the printed circuitry pattern, leaving an un-reflowed portion (9) and then removing (26) the un-reflowed portion of the substrate, leaving solidified solder (7) on the printed circuitry pattern of the substrate. Additionally, if desired, a part (12) having solder pads (14) can be placed on the solder (7) after tack media (13) is placed on the solder. Then the part (12) and substrate can be reflowed in an oven (34).

38 Claims, 9 Drawing Sheets

METHOD AND APPARATUS FOR SOLDER LASER PRINTING

TECHNICAL FIELD

This invention relates generally to a method and apparatus for solder deposition and, more particularly, to a method and apparatus for laser printing of solder onto a substrate.

BACKGROUND

The application of solder paste onto a printed circuit board (PCB) or substrate is typically done by forcing solder paste through a screen or stencil onto the substrate by a squeegee. Afterwards, surface mounted components and/or leaded components are placed on the PCB and then reflowed in an oven. This method works well with larger discrete components and many surface mounted and leaded integrated circuits and chip carriers. With the trend towards smaller components and smaller pitch between leads in components, the screening process becomes more difficult. Furthermore, each time a new circuit design is required, a new stencil is required. The new stencil increases cost and cycle time in the solder paste deposition process. Thus, a need exists for a method and apparatus for applying solder without a stencil which allows for easy manipulation of different circuit designs and accommodates the trend towards miniaturization and finer pitch between leads of integrated circuits.

SUMMARY OF THE INVENTION

A method for solder laser printing, comprises the steps of applying a predetermined thickness of solder to a substrate over a printed circuitry pattern on the substrate, laser printing to a reflow temperature the desired portions of solder on the printed circuitry pattern, leaving an un-reflowed portion and then removing or eliminating the un-reflowed portion from the substrate, leaving solidified reflowed solder on the printed circuitry pattern of the substrate.

DETAILED DESCRIPTION OF THE PREFERRED EMBODIMENT

Figure 1A:
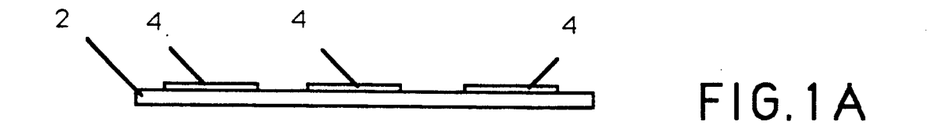
FIG. 1A is side view of a substrate having a printed circuit pattern in accordance with the present invention.
Figure 1B:
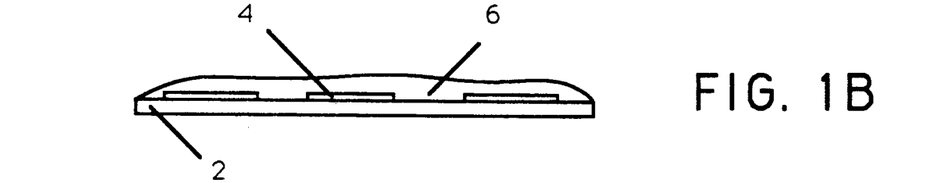
FIG. 1B is a side view of the substrate of FIG. 1A further having solder paste in accordance with the present invention.
Figure 1C:
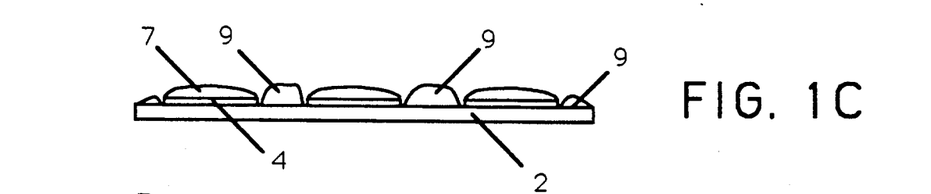
FIG. 1C is a side view of the substrate of FIG. 1B after laser printing in accordance with the present invention.
Figure 1D:
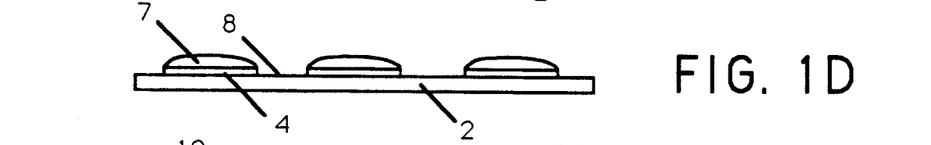
FIG. 1D is a side view of the substrate of FIG. 1C after removing the un-reflowed portion in accordance with the present invention.

Referring to FIG. 1A–FIG. 1G, there is shown a method for laser printed or reflowed solder paste deposition in accordance with the present invention. FIG. 1A illustrates a substrate 2 having a printed circuitry pattern 4 as in a typical printed circuit board (PCB). Referring to FIG. 1B, the solder 6 preferably in the form of paste or particles is applied to the substrate 2 preferably in a controlled coating of a predetermined thickness. Referring to FIG. 1C, the solder is then heated to a "reflow temperature" with a controlled laser beam in the areas where solder is typically screen printed or stencilled over the printed circuitry pattern areas leaving solidified solder 7 and un-reflowed solder portions 9. The laser printing is preferably done using a pattern that is downloaded from a computer aided design system used for manufacturing. Furthermore, the laser 24 (see FIG. 2) is preferably computer controlled having a focused beam that focuses substantially near the top surface of the substrate 2. The thickness of the solder can be controlled and built up similar to the method used in stereo lithography machine technologies "moving stage." This will become more apparent in reference to the explanation to FIGS. 5 and 6. Referring to FIGS. 1C and 1D, the "un-reflowed" portion 9 is then removed, leaving the reflowed, solidified solder 7, and the bare substrate 8 where the un-reflowed solder portion 9 was previously. Optionally, an in-line process for the removal and recycling of the residue solder will become evident with the explanation of FIGS. 7–10.

Figure 1E:
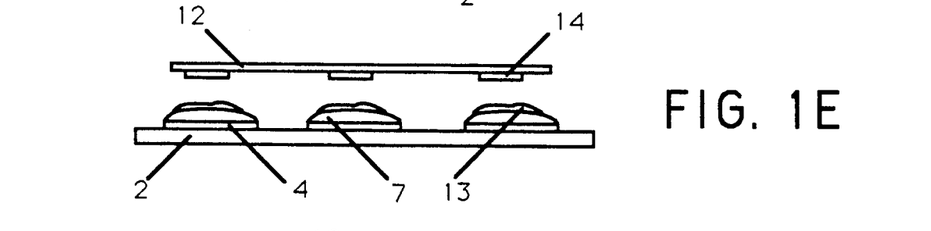
FIG. 1E is a side view of the substrate of FIG. 1D further having tack media above the solder and a part for placement onto the solder.
Figure 1F:
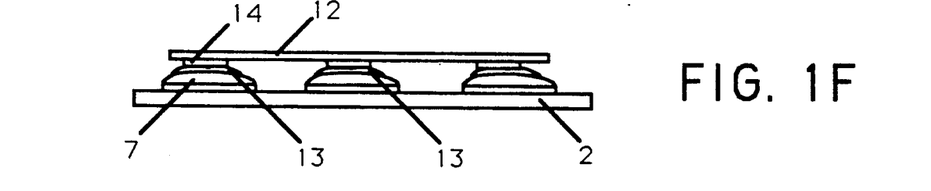
FIG. 1F is a side view of the substrate of FIG. 1E after the part is placed on the tack media in accordance with the present invention.
Figure 1G:
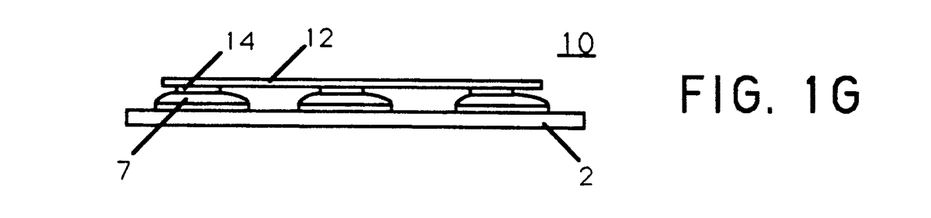
FIG. 1G is a side view of the substrate of FIG. 1F after reflow in accordance with the present invention.

After the steps illustrated in FIGS. 1A–1D, the substrate is ready for part placement. Optionally, the solidified solder 7 can be flattened (preferably using rollers, an ultrasonic press, a flattening plate, or a similar device) before the placement of parts. Referring to FIG. 1E and 1F, preferably, a tack media 13 such as a glue dot (placed between the solder on the substrate) or solder flux is placed on the solder 7 before a part 12 (having exposed circuit contacts 14) is placed on the substrate 2. The glue dot or flux preferably serves the purposes of cleaning the contact surfaces besides providing a tacky surface to prevent movement of the part during transport. Referring to FIG. 1G, after the part is placed on the solder 7 and the tack media 13, they are then reflowed, preferably in a reflow oven. The finished product is the substrate and part assembly 10 shown in FIG. 1G.

Figure 2:
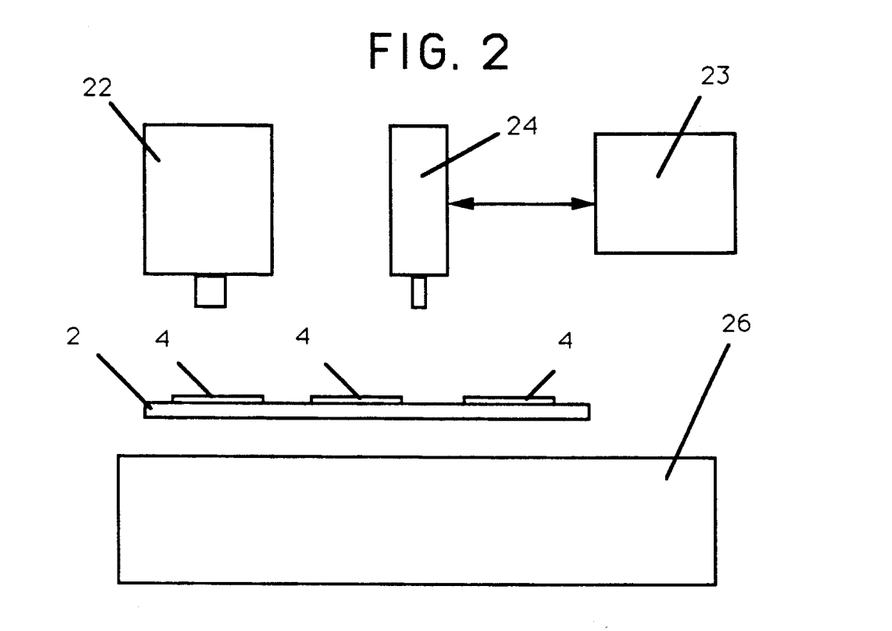
FIG. 2 is a block diagram of the laser printed solder deposition apparatus in accordance with the present invention.

Referring to FIG. 2, there is shown an apparatus for solder laser printing comprising a substrate 2 having a printed circuitry pattern 4, a means for applying a predetermined thickness of solder paste 22 such as a solder dispensing machine, roller, brush, spray, or a solder screening device (with or without the use of a stencil), and a laser 24 for laser printing predetermined patterns of solder (preferably down-loaded from a computer aided design (CAD) system or equivalent computer and memory device 23) to a reflow temperature on the substrate. The laser preferably reflows solder paste or solder particles over the printed circuitry patterns. After laser printing, the "un-reflowed" portion of the solder is removed using a means for removing 26 such as a spray bath device.

Figure 3:
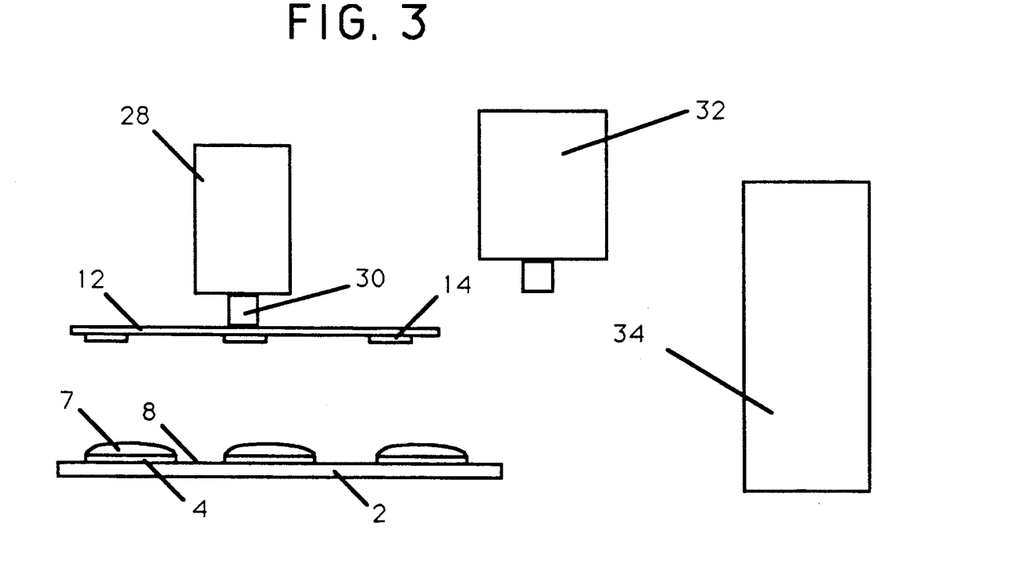
FIG. 3 is a block diagram of another aspect of the laser printed solder deposition apparatus in accordance with the present invention.

Referring to FIG. 3, another aspect in accordance with the present invention is shown. After the laser 24 is applied selectively to the substrate 2, leaving reflowed solder 7, and the "un-reflowed" solder is removed, a leaded or leadless component part 12, preferably having exposed circuit contacts 14 is placed on the solder 7. Before the part 12 is placed, a means for applying a tack media 32 preferably dispenses flux on areas where the circuit contacts 14 of the part 12 will interconnect with the solder 7 or a glue dot between the circuit contacts 14 of the part 12. The part is preferably placed using a means for placing 28 such as a robotic gripper preferably having a mechanical grip or a vacuum tip 30. Finally, the part 12 and substrate are placed in a means for reflowing 34 such as a conventional solder reflow oven. Of course, other means for applying tack media, other means for parts placement, and other means for solder reflowing is within contemplation of the present invention. The examples given are for mere illustration.

Figure 4A:
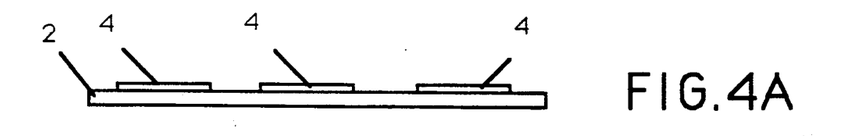
FIG. 4A–FIG. 4G are side views of other aspects of the laser printed deposition process in accordance with the present invention.
Figure 4B:
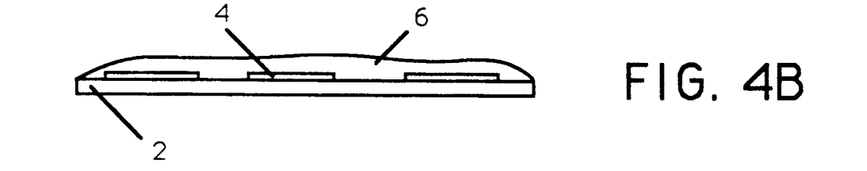
Figure 4C:
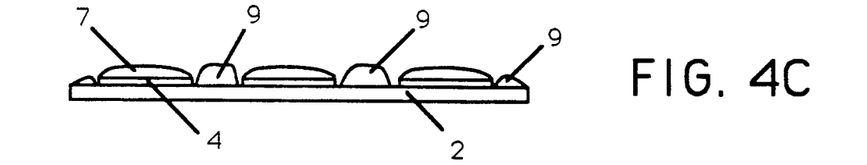
Figure 4D:
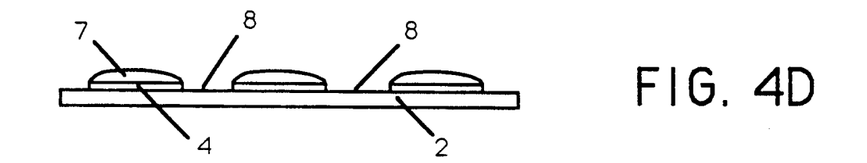
Figure 4E:
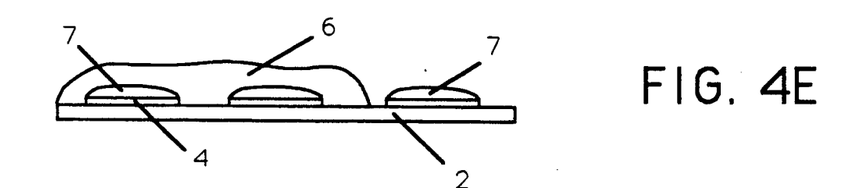
Figure 4F:
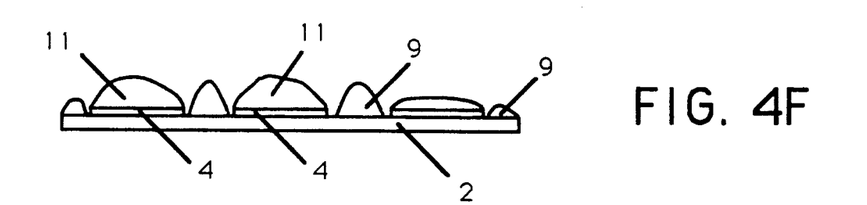
Figure 4G:
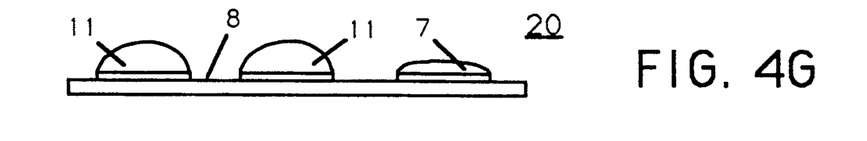
Figure 5A:
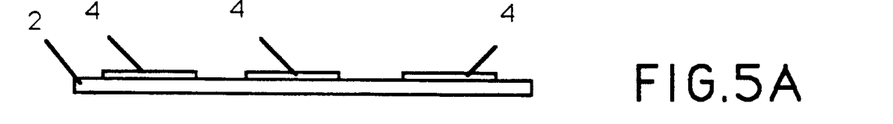
FIG. 5A–FIG. 5F are side views of other aspects of the laser printed deposition process in accordance with the present invention.
Figure 5B:
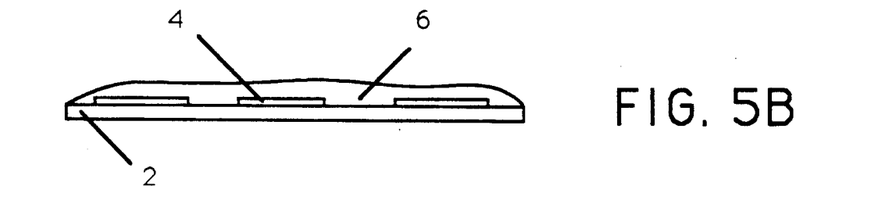
Figure 5C:
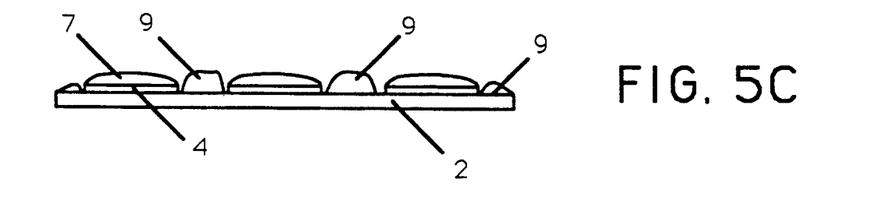
Figure 5D:
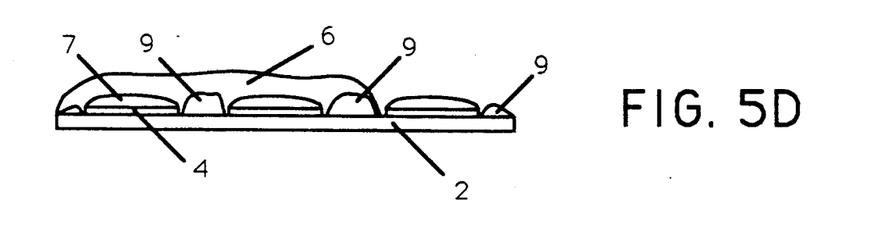
Figure 5E:
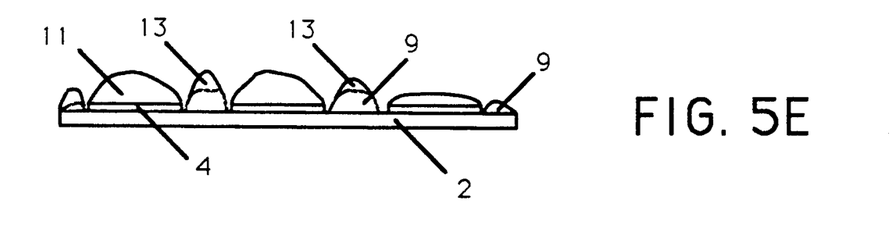
Figure 5F:
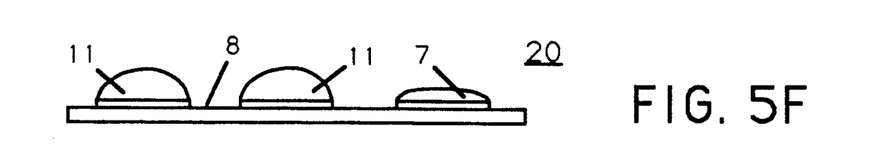

Referring to FIGS. 4A-4G, there is shown another aspect in accordance with the present invention. FIGS. 4A-4G illustrate the process of "building up" the thickness of the solder similar to the process used in stereo lithography. FIGS. 4A-4D is the same process described in FIGS. 1A-1D. In FIG. 4E, more solder 6 is applied to the desired area as shown, leaving one solder pad 7 as shown without another layer of solder to emphasize and illustrate the process. In FIG. 4F, the solder 6 is a laser pinted or reflowed as explained in reference to FIG. 1C in the desired pattern. Note that un-reflowed solder 9 remains soft, while the newly reflowed solder 11 along with old reflowed solder 7 (preferably not reflowed again) remains solidified. Then, referring to FIG. 4G, the un-reflowed solder 9 is removed. In this manner, the thickness of the solder 11 can be built up. If desired, the thickness of the solder 11 can be built up high enough to serve as tooling posts, connectors, contact pins, or other geometries by repeating the steps shown in FIGS. 4E-4G as necessary. Alternatively, FIGS. 5A-5F illustrate another similar process of "building up" the thickness of solder in accordance with the present invention. The main difference between the processes of FIG. 4 and FIG. 5 is that the solder does not need to be removed after step C in the process of FIG. 5. Regardless, both processes finish in a substrate assembly 20 having solidified solder posts or bumps (11 or 7). Referring to FIGS. 5A-5C, the process is the same as in FIGS. 1A-1C and FIGS. 4A-4C. In FIG. 5D, rather than removing the un-reflowed solder 9, more solder 6 is applied on top of the reflowed solder 7 as well as the un-reflowed solder 9. Referring to FIG. 5E, the desired pattern is again laser reflowed, leaving newly reflowed solder 11, the previously un-reflowed solder 9 and the "newly un-reflowed" solder 13 on top of the existing solder 9. Steps 5D and 5E can be repeated until the desired solder height is achieved. No removal of the un-reflowed solder (9 and 13 and other future layers not shown) is necessary until the last step where the solder is eventually removed as shown in FIG. 5F exposing the bare substrate 8.

Figure 6A:
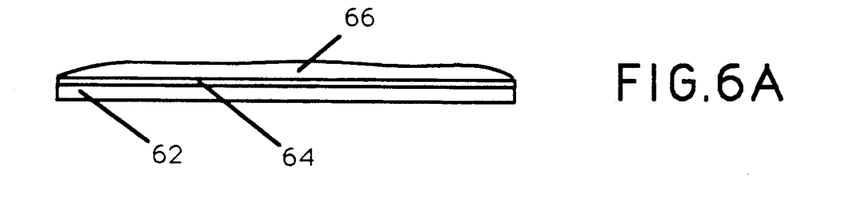
FIG. 6A–FIG. 6D are side views of other aspects of the laser printing deposition process in accordance with the present invention.
Figure 6B:
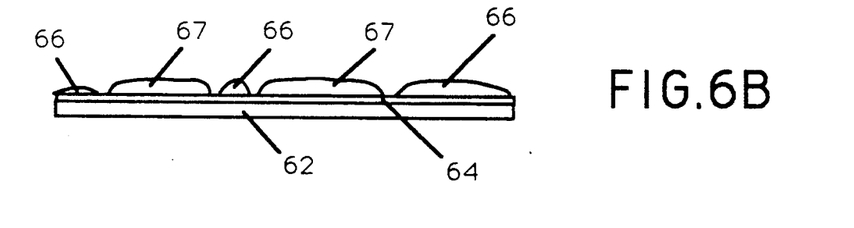
Figure 6C:
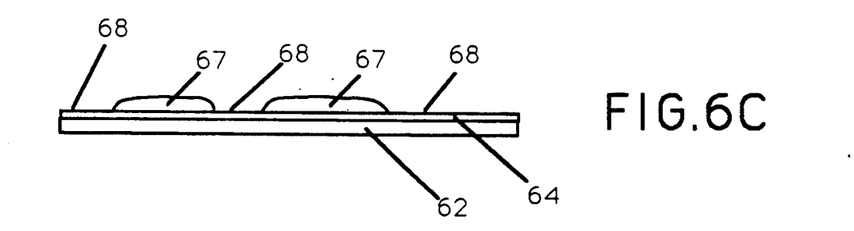
Figure 6D:
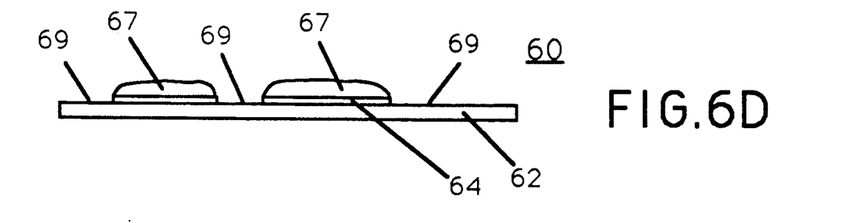

Referring to FIG. 6A-6D, there is shown a solder laser printing method in accordance with the present invention that could allow the printing of circuit runners. FIG. 6A illustrates a side view of a substrate 62 having a thin layer of metal 64 such as copper, and solder 66. Referring to FIG. 6B, the solder 66 is heated to a reflow temperature with a laser beam in a programmed circuit pattern (preferably down-loaded from a CAD/CAM system) leaving solidified solder 67 and the un-reflowed solder 66. Referring to FIG. 6C, the un-reflowed solder 67 is removed or eliminated leaving the substrate 62 and the thin layer of metal 64. Referring to FIGS. 6C and 6D, the thin layer of metal 64 not under the solidifier solder 67 (i.e., the exposed metal areas 68) is removed preferably by placing the substrate assembly 60 in an acid bath to remove the unwanted metal areas. The removed metal leaves the exposed substrate areas 69, which define the pattern of the circuit runners.

Figure 7:
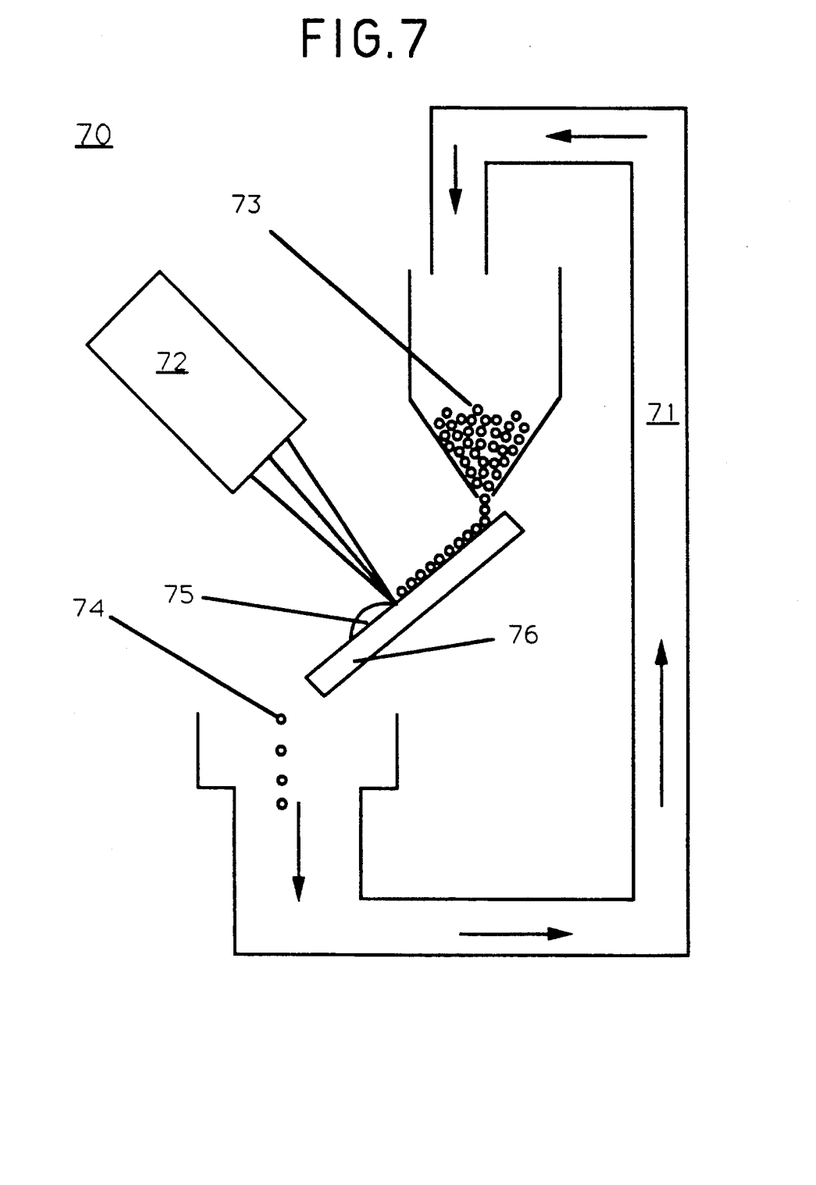
FIG. 7 is a side view of a solder laser printing apparatus with a cascading solder dispensing unit and a recycler in accordance with the present invention.

Referring to FIG. 7, a solder laser printing system 70 is shown preferably having a computer controlled laser 72 that reflows solder particles 74 into solid solder 75 onto a substrate 76. The solder particles 74 are preferably dispensed by cascading the particles evenly from a solder particle dispenser 73 across the substrate 76. The substrate is preferably tilted at an angle. The solder particles 74 that are un-reflowed preferably enter a recycler 71 that re-introduces the solder particles 74 back into the solder particle dispenser 73. Operationally, as the solder particles 74 evenly cascade across the fixed substrate 76, the programmed laser 72 reflows solder in a pre-programmed pattern. Alternatively, the laser 72 could be in a fixed position, while the substrate and dispenser are moved in a pre-programmed pattern.

Figure 8:
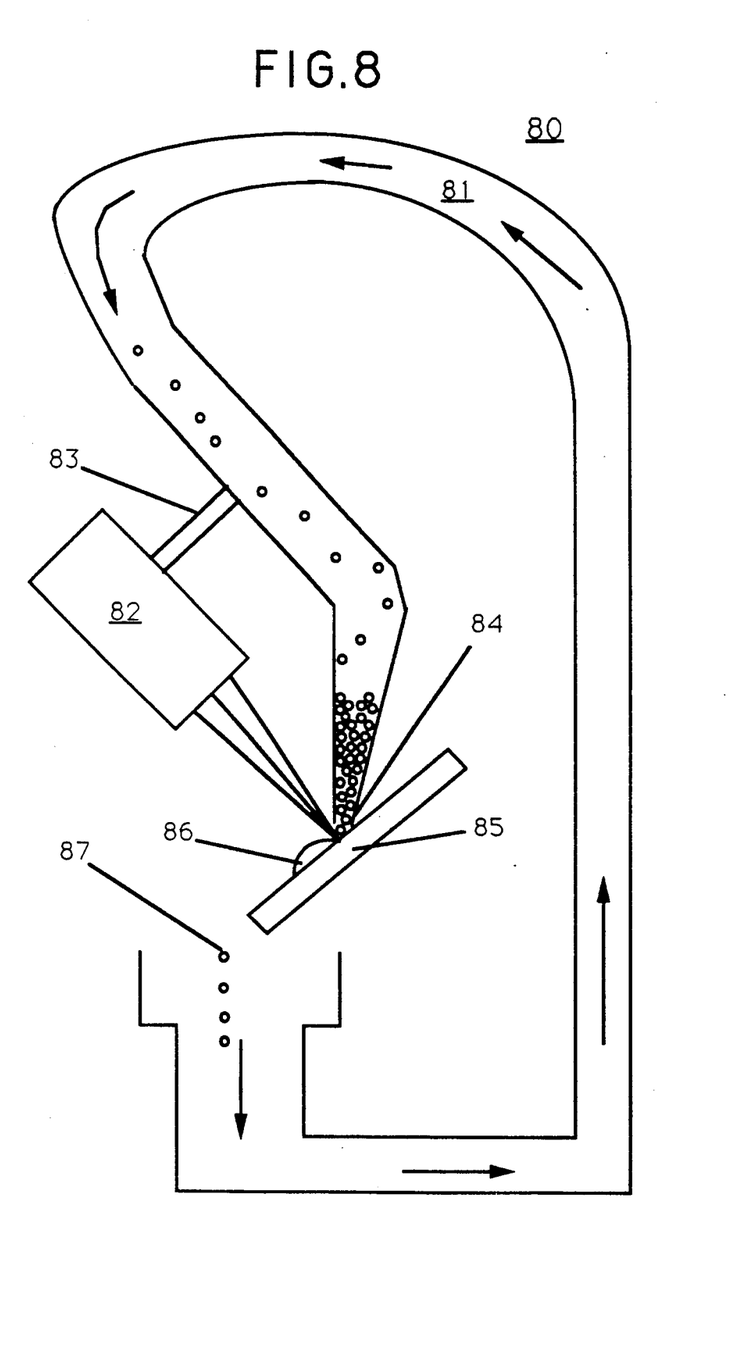
FIG. 8 is a side view of another solder laser printing apparatus with a precise solder dispensing unit and a recycler in accordance with the present invention.

Referring to FIG. 8, a solder laser printing system 80 similar to the system 70 is shown having a computer controlled laser 82 that reflows solder particles 87 into solid solder 86 onto a substrate 85. The solder particles 85 are preferably dispensed by a fixed nozzle 84 relative to the laser 82. The nozzle 84 is preferably mechanically attached to the laser by a support 83 so that the solder is reflowed as it is dispensed from the nozzle. Again, the substrate is preferably tilted at an angle. The solder particles 87 that are un-reflowed preferably enter a recycler 81 that re-introduces the solder particles 87 back into the solder particle dispenser or nozzle 84. Operationally, as the solder particles 87 are precisely dispensed as the programmed laser 82 reflows solder in a pre-programmed pattern achieved by a moving substrate holder (not shown). Alternatively, the laser 82 and nozzle 84 could move in a pre-programmed pattern, while the substrate remains fixed.

Figure 9:
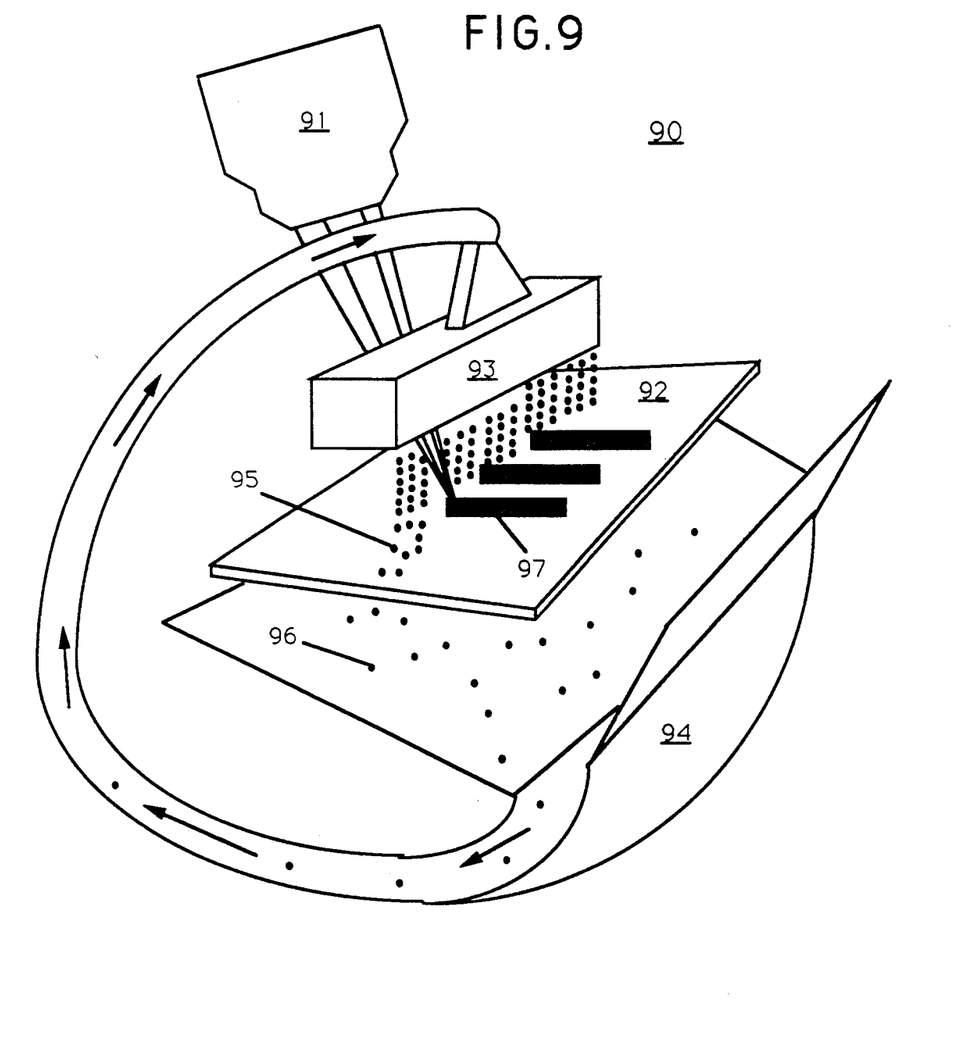
FIG. 9 is a side view of a solder laser printing apparatus with a spraying solder dispensing unit and a recycler in accordance with the present invention.

Referring to FIG. 9, a solder laser printing system 90 is shown having a computer controlled laser 91 that reflows solder particles 95 into solid solder circuit patterns 97 onto a substrate 92. The solder particles 95 are preferably dispensed by a sprayer 93 or a device consisting of a header with multiple nozzles or jets for the spray deposition of dry solder particles or alternatively solder paste over the surface of the substrate 92. The solder particles 96 that are un-reflowed are again preferably recycled in a recycler 94 that re-introduces the solder back into the sprayer 93. Operationally, as the solder particles 95 are sprayed over the surface of the substrate 92, the programmed laser 91 reflows solder in a pre-programmed pattern as previously discussed in reference to the solder laser printing systems 70 and 80.

Figure 10:
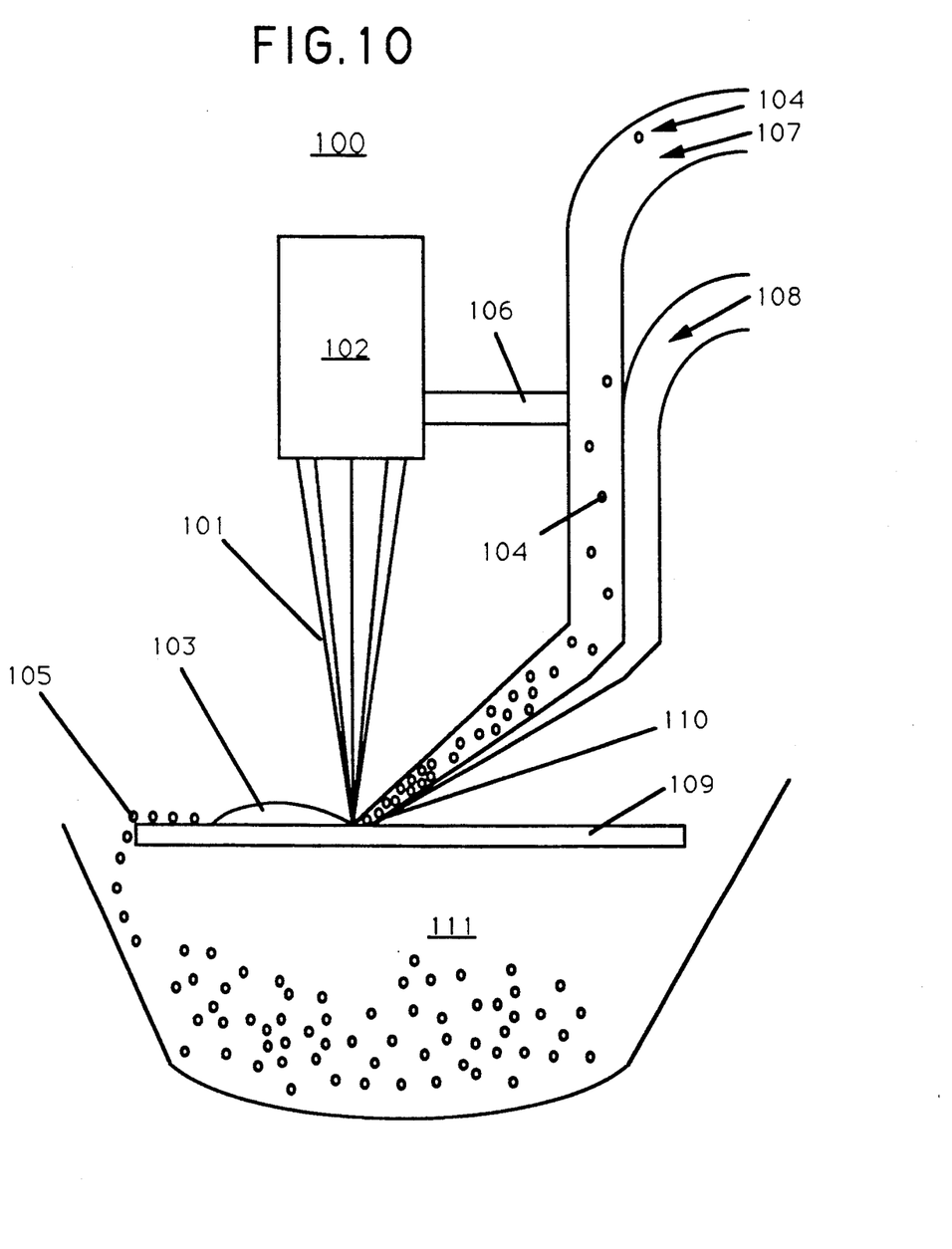
FIG. 10 is a side view of a solder laser printing apparatus in an inert atmosphere in accordance with the present invention.

Referring to FIG. 10, a solder laser printing system 100 is shown having a computer controlled laser or laser beam emitter 102 providing a focussed laser beam 101 that reflows solder particles 104 into solid solder 103 onto a substrate 109. Preferably, the entire system 100 is contained within an inert atmosphere to prevent the solder particles 104 from forming excessive amounts of oxides or other contaminants on their surfaces. If too much oxide forms on the surface of the solder particles, the solder has poor adhesion to the substrate surface. Therefore, the solder laser printing systems 70, 80 and 90 shown in FIGS. 7, 8 and 9 respectively are likewise preferably contained within an inert atmosphere.

The solder particles 104 in this embodiment are preferably dispensed by a fixed nozzle 110 relative to the laser 102. The nozzle 110 is preferably attached to the laser by a mechanical support 106 so that the solder particles 104 are reflowed as it is dispensed from the nozzle 110. Preferably, the solder particles 104 are dispensed along with an inert gas 107 such as nitrogen. Furthermore, to provide better adhesion to the substrate, a reactive gas 108 such as hydrogen of Formic acid should be mixed with the solder particles 104 and inert gas at the dispensing point. The solder particles 105 that are un-reflowed preferably enter a bin or holding tank 111 for subsequent recycling or re-use through the system 100. Operationally, the laser 102 and nozzle 110 are fixed and the substrate 109 is preferably mounted on an X-Y table (not shown) that moves in accordance with a pre-programmed pattern stored in a computer memory. This embodiment, along with the other embodiments disclosed should allow a user to create fine printed circuit patterns and solder pads less than 50 mils apart for fine pitched surface mounted and leaded components having many leads. The size of the pitch between solder pads or circuit patterns using the process of the present invention is limited primarily by the size of the solder particles available. Of course, other varied embodiments using different inert gases, reactive gases, and means for laser printing solder on a substrate in a pre-programmed pattern is within contemplation of the present invention.

What is claimed is:

1. A method for solder laser printing, comprises the steps of:
   providing a substrate having a printed circuitry pattern;
   applying a predetermined thickness of solder to the substrate including over the printed circuitry pattern;
   effecting a solder reflow temperature by the use of a laser beam for reflowing the solder on the printed circuit pattern, leaving an un-reflowed portion of solder effectively printing with solder; and
   removing the un-reflowed portion of solder on the substrate, leaving solidified solder on the printed circuitry pattern of the substrate.

2. The method of claim 1, wherein the method further comprises the step of flattening the solidified solder on the substrate.

3. The method of claim 1, wherein the method further comprises the steps of:
   placing a tack media over the solder on the printed circuitry pattern on the substrate or directly on the substrate between the printed circuitry pattern;
   placing a part over the solder, printed circuitry pattern and the tack media; and
   reflowing the part to the substrate.

4. The method of claim 2, wherein the method further comprises the steps of:
   placing a tack media over the solder on the printed circuitry pattern on the substrate or directly on the substrate between the printed circuitry pattern;
   placing a part over the solder, printed circuitry pattern and the tack media; and
   reflowintg the part to the substrate.

5. The method of claim 1, wherein the solder comprises solder paste.

6. The method of claim 1, wherein the solder comprises dry solder particles.

7. The method of claim 6, wherein the removal of the un-reflowed portion of solder is done by a vacuum, brush, or washer.

8. The method of claim 1, wherein the thickness of the solder can be controlled and built up.

9. The method of claim 1, wherein the printed circuitry pattern is down loaded from a data storage device.

10. The method of claim 5, wherein the data storage device resides in a computer aided design or manufacturing system.

11. The method of claim 6, wherein the method further includes the step of recycling the un-reflowed portion of solder.

12. An apparatus for solder laser printing, comprising:
    a substrate having a printed circuitry pattern;
    a means for applying a predetermined thickness of solder over the substrate and the printed circuitry pattern;
    a laser for effecting a solder reflow temperature by the use of a laser beam for reflowing the solder on the printed circuit pattern, leaving an un-reflowed portion of solder effectively printing with solder; and
    a means for removing the un-reflowed portion of solder from the substrate, leaving solidified solder on the printed circuitry pattern of the substrate.

13. The apparatus of claim 12, wherein the apparatus further comprises:
    a means for flattening the solidified solder on the substrate.

14. The apparatus of claim 12, wherein the apparatus further comprises:
    a means for applying a tack media on the printed circuitry pattern on the substrate or directly on the substrate between the printed circuitry pattern;
    a means for placing a part over the printed circuitry pattern and the tack media; and
    a means for reflowing the part to the substrate.

15. The apparatus of claim 13, wherein the apparatus further comprises:

a means for applying a tack media on the printed circuitry pattern on the substrate;

a means for placing a part over the printed circuitry pattern and the tack media; and a means for reflowing the part to the substrate.

16. The apparatus of claim 12, wherein the thickness of the solder can be controlled and built up.

17. The apparatus of claim 12, wherein the printed circuitry pattern is down loaded from a storage device.

18. The method of claim 12, wherein the memory device resides in a computer aided design system.

19. The apparatus of claim 12, wherein the means for placing a tack media comprises a flux dispensing unit.

20. The apparatus of claim 12, wherein the solder comprises dry solder particles.

21. The apparatus of claim 20, wherein the means for removing the un-reflowed portion of solder comprises a recycler.

22. The apparatus of claim 21, wherein the means for applying a predetermined thickness of solder comprises a solder particle reservoir that cascades solder across the substrate.

23. The apparatus of claim 22, wherein the apparatus is contained within an inert gas.

24. The apparatus of claim 22, wherein the means for applying a predetermined thickness of solder further comprises a mixture of gases.

25. The apparatus of claim 24, wherein the means for applying a predetermined thickness of solder further comprises the mixture of a reactive gas.

26. The appartus of claim 20, wherein the means for applying a predetermined thickness of solder comprises a solder particle reservoir that precisely dispenses solder on the printed circuitry pattern on the substrate as the solder is being reflowed by the laser.

27. The apparatus of claim 26, wherein the apparatus is contained within an inert gas.

28. The apparatus of claim 26, wherein the means for applying a predetemined thickness of solder further comprises a mixture gases.

29. The apparatus of claim 28, wherein the means for applying a predetermined thickness of solder further comprises the mixture of a reactive gas.

30. The apparatus of claim 20, wherein the means for applying a predetermined thickness of solder comprises a solder particle reservoir that sprays solder across the substrate.

31. The apparatus of claim 30, wherein the apparatus is contained within an inert gas.

32. The apparatus of claim 30, wherein the means for applying a predetermined thickness of solder further comprises the mixture of gases.

33. The apparatus of claim 32, wherein the means for applying a predetermined thickness of solder further comprises the mixture of a reactive gas.

34. A method for solder laser printing, comprises the steps providing a substrate having a thin layer of metal on at least one side;

applying a predetermined thickness of solder on the thin layer of metal; p1 laser printing to a reflow temperature portions of the solder on the substrate in a predetermined pattern, leaving an un-reflowed portion of solder; and removing the un-reflowed portion of solder on the substrate, leaving solidified solder and exposed areas of the thin layer of metal;

removing the exposed areas of the thin layer of metal, forming a printed circuitry pattern on the substrate.

35. The method of claim 34, wherein the thin layer of metal comprises copper.

36. The method of claim 34, wherein the solder comprises solder paste.

37. The method of claim 34, wherein the solder comprises dry solder particles.

38. The method of claim 34, wherein the step of removing the un-reflowed portion of solder comprises the use of fluid pressure such as a vacuum.

* * * * *